United States Patent [19]
Leeb

[11] Patent Number: 5,435,746
[45] Date of Patent: Jul. 25, 1995

[54] ARRANGEMENT FOR ESTABLISHING ELECTRICAL CONTACT IN JOINTS, AND A METHOD OF PRODUCING THE ARRANGEMENT

[75] Inventor: Karl-Erik Leeb, Djurhamn, Sweden

[73] Assignee: Telefonaktiebolaget LM Ericsson, Stockholm, Sweden

[21] Appl. No.: 216,828

[22] Filed: Mar. 24, 1994

[30] Foreign Application Priority Data

Mar. 24, 1993 [SE] Sweden ................. 9300966

[51] Int. Cl.⁶ ........................................ H01R 4/24
[52] U.S. Cl. ............................. 439/387; 439/927
[58] Field of Search .............. 439/397, 927, 387; 174/51, 140 R, 151; 361/800, 816

[56] References Cited

U.S. PATENT DOCUMENTS 3,693,130  9/1972  Pankow ................. 439/927
4,329,780  5/1982  Somers ................. 439/927

FOREIGN PATENT DOCUMENTS 6463205  3/1989  Japan ................. 439/397

Primary Examiner—David L. Pirlot
Assistant Examiner—Jill DeMello
Attorney, Agent, or Firm—Burns, Doane, Swecker & Mathis

[57] ABSTRACT

An arrangement for establishing electrical contact in joints, and a method of producing the arrangement. The arrangement comprises an electric contact making device which is enclosed in a joint between two metal surfaces between which electrical contact shall be established. The joint and the contact making device are held together and protected by plastic material. The arrangement is produced by applying pressure to the joint so that the surface penetrating devices of the contact making device will spring, and by converting the plastic material from a fluid state to a solid state while maintaining the pressure, so that the resilient biassing effect of the surface penetrating devices against the metal surfaces will be made permanent in the arrangement.

8 Claims, 3 Drawing Sheets

ARRANGEMENT FOR ESTABLISHING ELECTRICAL CONTACT IN JOINTS, AND A METHOD OF PRODUCING THE ARRANGEMENT

BACKGROUND

The present invention relates to the establishment of a uniformly distributed electric contact along a joint between two metal surfaces.

When establishing an electric contact between different metal surfaces, there is often a need to obtain uniform distribution of the electrical conductivity of the intended contact surface, and to ensure that this distribution will remain constant during the lifetime of the equipment concerned. This need is particularly manifest in the screening of electromagnetic radiation in such apparatus as computers, radios and radar equipment, for instance. In these contexts, the screening devices often have the form of lidded metal boxes which enclose the electronics and short circuit the electromagnetic fields so as to avoid interaction as a result of electromagnetic induction. At high frequencies, the electromagnetic radiation can be conducted very easily through joints in the metal boxes, resulting in poor attenuation. In order to prevent this, it is necessary to dispose and distribute the electric contact along the joints in a manner to short-circuit the field along the joints. The problem is that electric contact often occurs only at certain points along the length of the joint. It is often at these points that screws and other fastener devices exert a concentrated pressure so that microscopic parts of the surface cut through the oxide layer and contaminants and create a direct metallic connection. At high frequencies, it is necessary to dispose these contact points at a given density along the joints, so as to obtain good attenuation. The distance between each contact point must be made progressively shorter with progressively higher radiation frequencies, which can be calculated by known radiation physical principles. Uniform distribution of the electrical conductivity is often achieved with the aid of packings comprised of felted metal fibres or metal foil strips which have been embossed in a manner such as to obtain resilient parts repeatedly along the length of the joint. Rubber packings which include metal or carbon fillers are also used with the intention of combining an elastic and electrically conducting packing function. Despite these arrangements, it is often difficult to maintain an effective screening function under different circumstances and during the useful life of the equipment.

The positioning of the screws along the joint and the evenness with which the screws are tightened is highly significant to the screening effect obtained. The material thickness of the lid, for instance, is also highly significant in maintaining joint pressure, which is one prerequisite of a uniformly distributed contact and therewith screening. Materials which form oxidized surface layers are highly disadvantageous, since conditions under which these surface layers can be penetrated are lacking. Penetration of such surfaces would require a much higher joint pressure or require the joint surfaces to comprise noble metals, such as gold, copper or silver. From a constructional and technical aspect, those metals which do not easily oxidize present a serious drawback because they are both heavy and expensive. Plating or cladding of aluminium alloys, for instance, is both complicated and subjected to quality problems. If aluminium is to be contacted electrically, it is necessary to penetrate the very hard aluminium-oxide surface of the metal, which requires the application of a very high punctiform pressure. If a large number of such points or sites are to be contacted electrically, the combined joint pressure will be very high. When applying established methods, a serious problem arises in obtaining such contact points simultaneously. Added to this is the desire to use inexpensive, lightweight materials and only a few fastener devices, for both technical and economical reasons.

SUMMARY

The present invention relates to an arrangement for establishing electrical contact in joints, and also to a method of manufacturing one such arrangement, the object of the inventive arrangement being to solve the aforesaid problems associated with the use of established techniques.

The arrangement includes a device which cuts into the adjacent metal surfaces along the length of the joint at short intervals, wherein the joint surfaces and the contact making device are held fixed and protected against oxidation by a plastic material which adheres to the surfaces. The method of producing the arrangement enables the application of a very large joint pressure in conjunction with sealing, which enables effective penetration of the oxide layer, and the contact making device is pre-tensioned and fixed in this pre-tensioned state by the plastic material prior to removing the joint pressure.

The arrangement solves several problems associated with the establishment of an electric contact over large surfaces, such as safer contacts, even when the electrically contacted parts have a small material thickness. Moreover, the contacted parts are protected against oxidation and environmental influences, and the electrically contacted parts remain fixed even should the surfaces be bent or curved and the shape of said surfaces changed. The arrangement is inexpensive and simple to produce, and the materials used are cheap and environmentally friendly.

The present invention will now be described with reference to preferred exemplifying embodiments thereof and also with reference to the accompanying drawings.

DETAILED DESCRIPTION

Various variants of one embodiment of the invention are described below with reference to the accompanying drawings. The described embodiment can vary in different ways and is only limited by the scope of the following claims.

Figure 1:
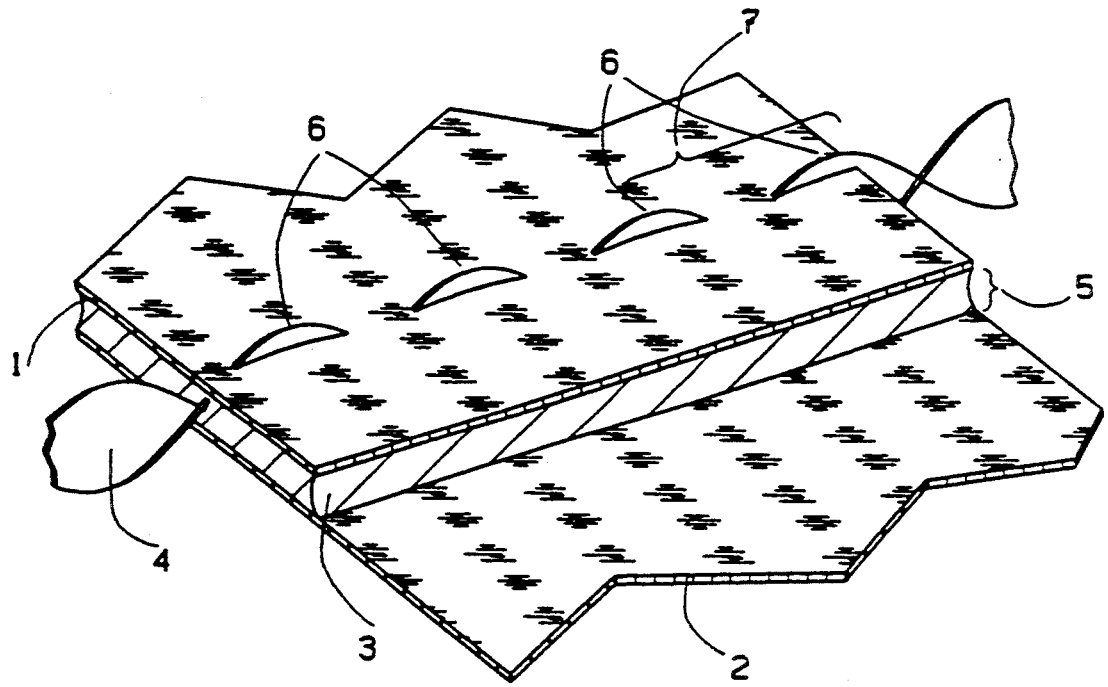
FIG. 1 is a perspective view of one embodiment of the inventive arrangement.

FIG. 1 illustrates two thin metal plates 1, 2, which preferably have a thickness of 0.01–0.5 mm and which are held fixed mutually in position by a plastic material 3. The plastic material 3 is highly adhesive to the plates 1, 2 and may either be comprised of a thermosetting resin, for instance epoxy resin, or a thermoplastic resin, for instance an ionomeric resin. An example of an ionomeric resin is the commercially available resin Surlyn R which is comprised of polyethylene modified with carboxyl groups which have been linked together with zinc ions so as to obtain cross-linking. The cross-links release reversibly at 200° C. and the material becomes thermoplastic at temperatures above this temperature and then has a reactivity which provides good bonding with metal surfaces, so as to obtain adhesion to the plates 1, 2 and to the electric contact making device 4. The electric contact making device 4 is comprised of a metal band or strip having a cross-sectional dimension of 0.1×1 mm. The band is twisted around its long axis, so that its maximum cross-sectional measurement will be oriented at right angles to the plane of the plates 1, 2 at intervals of 0.5 revolution, at the position of the plane between said intervals. The joint width or depth 5 between the plates 1, 2 constituted by the intermediate plastic material 3 is much smaller than the largest cross-sectional measurement of the metal band 4 and the hardness of the band is greater than the hardness of the plates 1, 2, wherein those parts that are located close to the right-angle position relative to the plane of the plates 1, 2 form surface penetrating devices 6 which occur repeatedly along the length of the contact making device 4 and which penetrate the surfaces in the plane of the plates 1, 2. The joint depth 5 is much greater than the smallest cross-sectional measurement of the contact making device 4, and at those points along the longitudinal axis of the contact making device 4 that are located centrally between where those points on the device 4 at which the penetrating devices 6 penetrate to form the contact positions in the plates 1, 2, and where the cross-section of the contact making device 4 is oriented generally parallel with the plates 1, 2, the contact making device 4 is fully embraced by the plastic material 3 and the plates 1, 2 are not penetrated at these points and the plastic material 3 in the joint 5 has the maximum ability of mutually joining the plates 1, 2 and the contact making device 4 by virtue of its adhesion. At those locations in the vicinity of the surface penetrating devices 6 at which the contact making device 4 penetrates the plates 1, 2, the metal in the plates 1, 2 and the surface penetrating devices 6 of the contact making device 4 have cut into one another and therewith also penetrated the oxide layers, and the thus formed metallic contact points are fixated mechanically by the plastic layer 3 so as to avoid a defective contact, at the same time as the plastic material 3 protects the contact points against an oxidizing influence.

By varying the helical pitch of the twisted metal band forming the contact making device 4, it is possible to provide the electrical contact points at the surface penetrating devices 6 with a desired density in relation to what is desired and what may depend on a given attenuation at a given electromagnetic radio frequency. The thus formed joint combines a row of uniformly distributed electrical contact points 6 and leaves in the plates 1, 2 intermediate surfaces which are unaffected and have maximum mechanical strength, at the same time as the joint 5 is fixated and protected against oxidation by the plastic material 3, therewith providing a high quality joint which possesses desired mechanical and electrical properties, with the aid of simple means.

One feature which further improves the reliability of the electrical contact over a long term is that the metal band in the contact making device 4 at those points which form the surface penetrating devices 6 has a varying abutment angle of about 90 degress to the plates 1, 2, which causes the plates to spring in a torsional fashion around the longitudinal axis of the contact making device 4 as the surface penetrating devices 6 penetrate the surface of the plates 1, 2. When fixating the joint 5, by bringing the plastic material 3 to a solid state, the torsion generated by the surface penetrating devices 6 is maintained by virtue of maintaining a joint pressure during the solidification phase, meaning that the surface penetrating devices 6 will be located in the joint 5 while exerting a spring pressure which biases the surface penetrating devices towards the contact surfaces. This bias is further increased by the contraction forces exerted by the plastic material 3 in the joint 5 as the plastic material cools, due to the fact that the plastic material 3 has a higher coefficient of thermal expansion. This biassing of the contact making device 4 towards the contact points on the plates 1, 2 is highly significant in maintaining positive electric contact when the joint is subjected to different mechanical forces.

Figure 2:
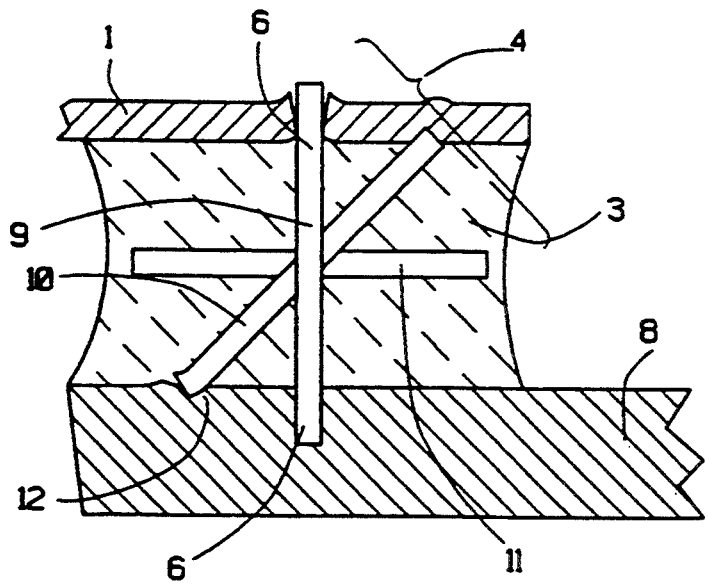
FIG. 2 is a cross-sectional view of one embodiment of the inventive arrangement.

FIG. 2 is a cross-sectional view of one variant of the arrangement, in which a plate 1 has been joined to a metal piece 8 which is much thicker than the plate 1. The Figure illustrates the contact making device 4 positioned at an angle of 90 degrees at 9, at an angle of 45 degrees at 10 and a position in which the contact making device 4 is parallel with the plate 1 and the joint surface of the metal member 8, at 11. The contact making device 4 shown positioned in its different angles 9, 10, 11 is of the same construction as that described with reference to FIG. 1. When positioned at an angle of 90 degrees, as shown at 9, the penetration devices 6 of the contact making device 4 will have penetrated the plate 1 and a small impression is formed in the metal member 8. When the contact making device is angled at 45 degrees, as shown at 10, the device will engage the metal member 8 obliquely, as at 12, and consequently the contact making device 4 in this part has slid into the engagement 12 on the metal member 8. This smaller penetration depth 12 is compensated for by the fact that the oblique penetration of the contact making device shovels away oxides and provides a relatively large contact surface.

The plate 1, the contact making device 4 and the metal member 8 are fixated in their mutual positions relative to one another by the plastic material 3, this fixation being achieved so that the contact making device 4, in particular at those points where the contact making device is obliquely positioned, such as at 10, and the plate 1 will be located in a downwardly sprung position, which further contributes towards a safe and lasting contact function. The metal member 8 may be comprised of combinations of different metals, and the function is the same even when using a laminate of tinned copper foil and fiberglass reinforced plastic, such as laminates used on electronic circuit boards.

Figure 3:
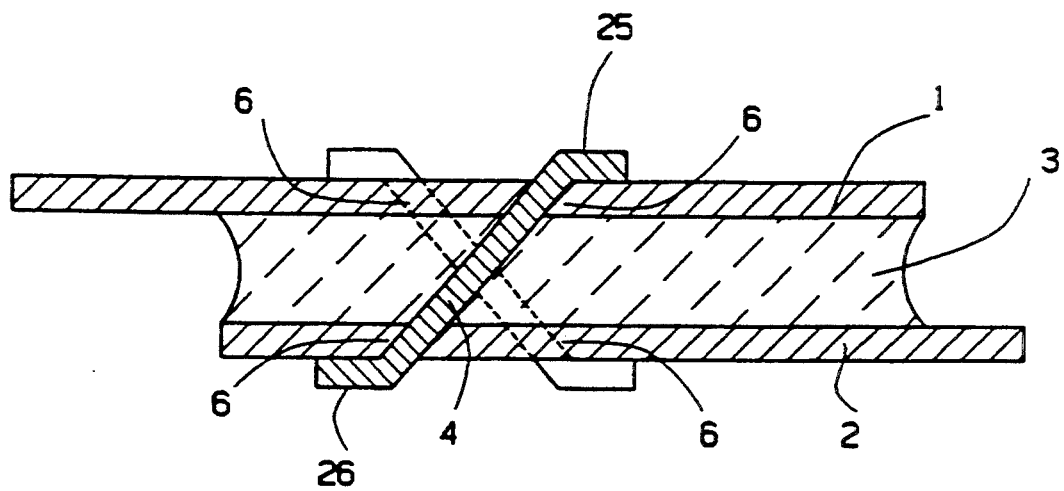
FIG. 3 is a cross-sectional view of one embodiment of the inventive arrangement.

FIG. 3 illustrates a variant of the arrangement in which two thin plates 1, 2 have been fixed to one another with the aid of an intermediate plastic material 3 and a contact making device 4 which is comprised of a twisted metal band or strip similar to that illustrated in FIG. 1. In the FIG. 3 embodiment those surface penetrating devices 6 of the device 4 that have fully penetrated the plates 1, 2, have been upset as shown at 25, 26, which further improves the mechanical strength and the electrical efficiency of the contact achieved.

Figure 4:
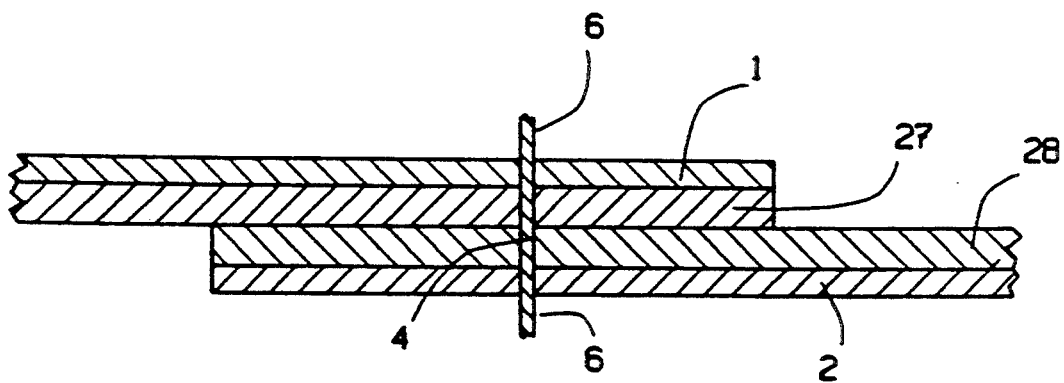
FIG. 4 is a cross-sectional view of one embodiment of the inventive arrangement.

FIG. 4 is a cross-sectional view of one embodiment of the arrangement in which a laminate comprising aluminium sheet 1 having a thickness of 0.015 mm and a polyethylene sheet 27 having a thickness of 0.1 mm have been joined to another laminate comprised of aluminium sheet 2 and polyethylene sheet 28, and where a contact making device 4 of the same configuration as that shown in FIG. 1 has been placed in the joint. This cross-sectional view shows the contact making device 4 at that part of the helix which is at right angles to the plane of the sheets 1, 2 and where the contact making device 4 forms the surface penetrating devices 6. The polyethylene sheets 27, 28 in the laminate structure are melt-welded or fused together and form a coherent plastic sheet which fixates the joint region and the contact making device 4 and protects the surface penetrating devices 6 of the contact making device 4 and the surfaces of the surface penetrating devices 6 which abut the foils 1, 2 against oxidation.

In the case of a further embodiment which is not shown in the drawings, a plurality of surface penetrating devices 6 are distributed, either randomly or in an ordered fashion, at a given average distribution over the surfaces of the joint 5. In this case, the surface penetrating devices 6 have no mechanical linking means, but are distributed by a method of applying the devices against one of the joint surfaces. For instance, the surface penetrating devices 6 of this embodiment may have the form of clipped and shaped small resilient elements which function in the same manner as those in the other embodiments.

Figure 5:
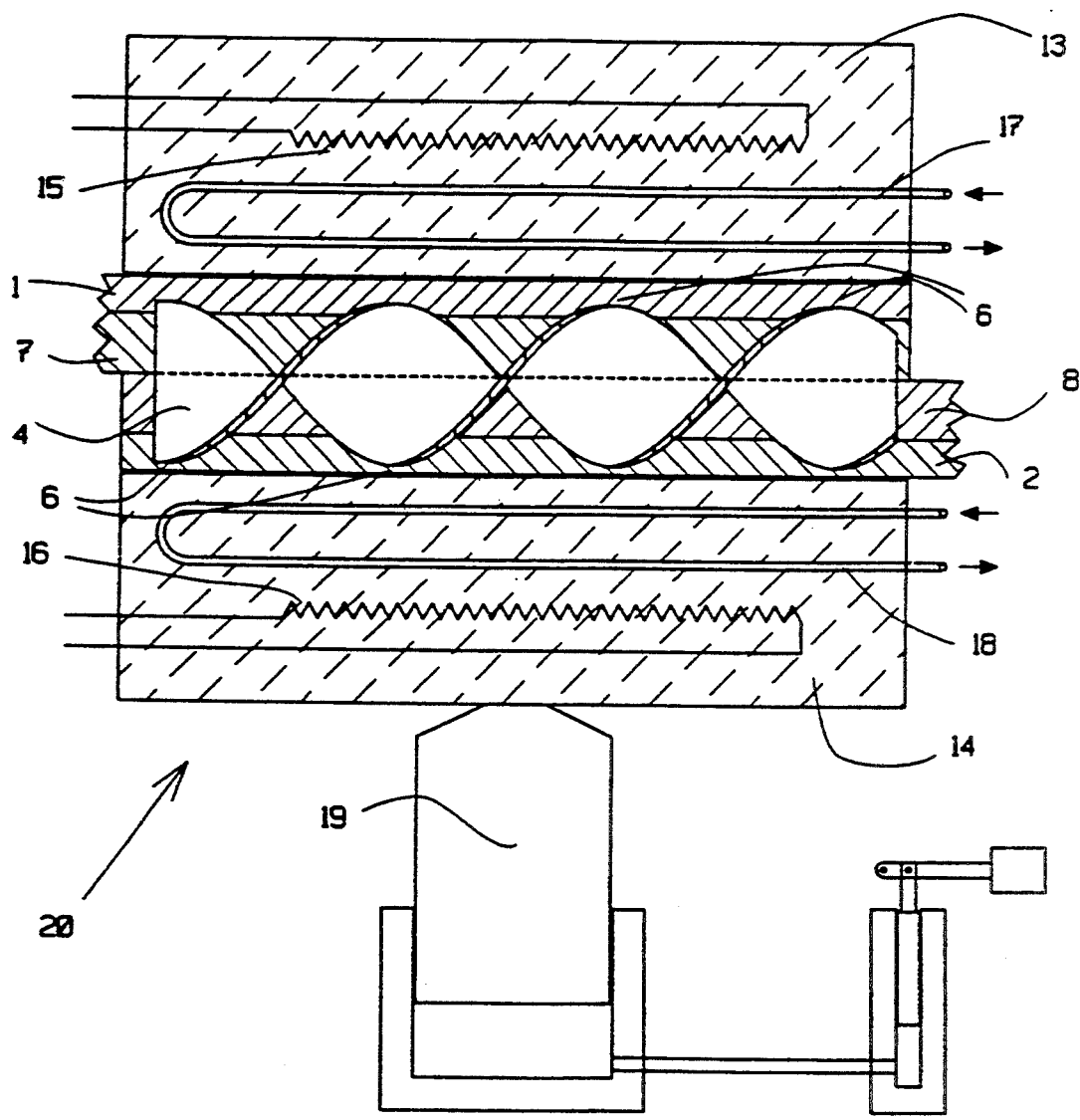
FIG. 5 illustrates apparatus for use in a method for producing the inventive arrangement, said arrangement being shown during its production.

The method in which an arrangement for establishing electrical contacts in joints can be produced in accordance with the present invention is shown in one exemplifying embodiment with the aid of apparatus illustrated in FIG. 5.

In the FIG. 5 illustration, two laminates comprised of aluminium sheets 1, 2 and polyethylene sheets 27, 28 are joined with an intermediate contact making device 4, according to the same principles as those described with reference to FIG. 4. The thicknesses of the sheets 1, 2; 27, 28 and the thickness of the contact making device 4 are not according to scale and have been greatly exaggerated in relation to the remainder of the apparatus, for the sake of clarity. A sheet laminate 1, 27 has been spliced with another sheet laminate 2, 28 and electrical contact has been achieved with the contact making device 4, which has the same configuration as that described with reference to FIG. 1. In the process of manufacture, the arrangement is clamped between two flat-ground metal blocks 13, 14 with the aid of a hydraulic piston 19, said piston exerting, for instance, a surface pressure of 200 N/cm$^2$ on the arrangement. The metal blocks 13, 14 are provided with electric heating elements 15, 16 and water cooling channels 17, 18.

The arrangement is produced in the following manner:

The sheet laminate 1, 27 and the sheet laminate 2, 28 with the contact making device 4 placed therebetween are first placed between the metal blocks 13, 14. The pressure exerted by the hydraulic piston 19 at this stage is negligible and the temperature of the metal blocks 13, 14 is about 20° C. The temperature of the metal blocks 13, 14 is then raised to 150° C. with the aid of the heating elements 15, 16, wherein heat is transferred to the sheet laminate 1, 27 and the laminate 2, 28, causing the polyethylene sheets 27, 28 to soften to a highly viscous consistency. Pressure is then applied with the hydraulic piston 19 to a surface pressure of 100–200 N/cm$^2$ on the surface which the metal blocks 13, 14 exerts on the laminate 1, 27 and the laminate 2, 28. At this stage, the polyethylene sheet surfaces 27, 28 face towards one another and the contact making device 4 penetrates the polyethylene sheet surfaces 27, 28. At this temperature, the polyethylene is not so viscous as to flow away from the joint area. The distance between the aluminium sheets 1, 2 therefore remains generally the same. A weld joint is formed in the two sheet surfaces 27, 28, so as to form a practically homogeneous joint. Any gas inclusions are reduced at the pressure applied. The vertical parts of the contact making device 4, these vertical parts forming the surface penetrating devices 6, now penetrate through the oxide layers and surfaces of the aluminium sheets 1, 2. The surface penetrating devices 6 are able to fully penetrate the aluminium foils 1, 2, depending on the thickness and the hardness of said aluminium sheets 1, 2. Should the surface penetrating devices 6 fully penetrate the aluminium sheets and strike against the surfaces of the metal blocks 13, 14, the surface penetrating devices 6 will be upset, as illustrated in FIG. 3. On the other hand, if a soft insert, for instance a paper insert, is placed between the aluminium sheets 1, 2 and the metal blocks 13, 14, the surface penetrating devices will not be upset on the outside of the aluminium sheets 1, 2, as illustrated in FIG. 1.

Those parts of the surface penetrating devices 6 which are not oriented precisely at an angle of 90 degrees to the surfaces of the aluminium sheets 1, 2 will be sprung to one side. The arrangement is cooled in this state of manufacture by spraying cooling water into the passageways 17, 18 in the metal blocks 13, 14. The polyethylene 27, 28 in the joint will then harden and form a homogenous joint which fixes the aluminium sheets 1, 2 together and the spring-biassing action of the contact making device 4 in the joint is made permanent.

The apparatus for producing the arrangement can be varied in many different ways. For instance, heating and cooling can be effected with hot and cold air in the metal blocks or by heating with ultrasonics. The pressure exerted on the press may also be achieved in different ways.

The invention is not restricted to the aforedescribed and illustrated exemplifying embodiments thereof and modifications can be made within the scope of the following claims.

What is claimed is:

1. An arrangement for establishing electrical contacts in a metal surface joint to achieve uniformly distributed electric conductivity along the joint, comprising:
    a joint formed between two metal surfaces, wherein the joint is filled with a plastic material which adheres to the metal surfaces; and
    an electric contact making device disposed between the metal surfaces, wherein the electric contact making device includes surface penetrating devices which at delimited parts cut through the metal surfaces so as to form electric contacts between the metal surfaces in a manner such that the electric contacts are distributed along the joint in a controlled manner, and the electric contacts are protected against oxidation by the plastic material.

2. An arrangement according to claim 1, wherein the plastic material in the joint is a thermoplastic material.

3. An arrangement according to claim 2, wherein the contact making device extends along a full extension of the joint.

4. An arrangement according to claim 1, wherein the contact making device extends along a full extension of the joint.

5. An arrangement according to claim 4, wherein the contact making device is a metal band which has been worked so that the surface penetrating devices cut into the metal surfaces at predetermined intervals along a longitudinal axis of the bar.

6. An arrangement according to claim 5, wherein the metal band which has been twisted around its longitudinal axis so that when positioned in the joint, it cuts into the metal surfaces at each half-revolution twist along its longitudinal axis, and the metal surfaces are left unaffected at remaining locations along the longitudinal axis of the electric contact making device.

7. An arrangement according to claim 6, wherein the plastic material in the joint is ionomeric plastic.

8. A method of producing the arrangement according to claim 1, comprising the steps of subjecting the metal surfaces containing the plastic material and the electric contact making device placed therebetween to an overpressure which is directed at right angles to the plane of the metal surfaces while the plastic material is in a fluid state; and bringing the plastic material to a solid state with a residual overpressure so that the surface penetrating devices of the electric contact making device obtain a mechanically biassed contact pressure which remains permanently in the arrangement.

* * * * *